(12) United States Patent
Hijzen et al.

(10) Patent No.: US 8,133,791 B2
(45) Date of Patent: Mar. 13, 2012

(54) METHOD OF MANUFACTURING A BIPOLAR TRANSISTOR AND BIPOLAR TRANSISTOR OBTAINED THEREWITH

(75) Inventors: Erwin B. Hijzen, Blanden (BE); Philippe Meunier-Bellard, Kortenberg (BE); Johannes J. T. M. Donkers, Valkenswaard (NL)

(73) Assignee: NXP B.V., Eindhoven (NL)

( * ) Notice: Subject to any disclaimer, the term of this patent is extended or adjusted under 35 U.S.C. 154(b) by 542 days.

(21) Appl. No.: 12/306,653

(22) PCT Filed: Jun. 12, 2007

(86) PCT No.: PCT/IB2007/052226
§ 371 (c)(1),
(2), (4) Date: Jul. 17, 2009

(87) PCT Pub. No.: WO2008/001249
PCT Pub. Date: Jan. 3, 2008

(65) Prior Publication Data
US 2010/0068863 A1    Mar. 18, 2010

(30) Foreign Application Priority Data
Jun. 28, 2006    (EP) ..................... 06116194

(51) Int. Cl.
*H01L 21/331*    (2006.01)
(52) U.S. Cl. ........ 438/312; 438/309; 438/313; 438/320; 438/339; 438/345; 257/E21.371
(58) Field of Classification Search .......................... None
See application file for complete search history.

(56) References Cited

U.S. PATENT DOCUMENTS

| | | | |
|---|---|---|---|
| 5,523,606 A | 6/1996 | Yamazaki | |
| 5,620,908 A | 4/1997 | Inoh et al. | |
| 6,472,262 B2 | 10/2002 | Chantre et al. | |
| 6,509,242 B2 | 1/2003 | Frei et al. | |
| 6,531,369 B1 | 3/2003 | Ozkan et al. | |
| 6,869,852 B1 * | 3/2005 | Joseph et al. | 438/309 |

FOREIGN PATENT DOCUMENTS
EP    0768716 A1    4/1997

OTHER PUBLICATIONS

Bock, J., et al; "SIGE Bipolar Technology for Automotive Radar Applications"; IEEE BCTM 4.2; 2004; pp. 84-87.
Chevalier, P, et al; "230 GHZ Self-Aligned Sigec HBT for 90 NM BICMOS Technology"; IEEE BCTM 12.1; 2004; pp. 225-228.
Deixler, P., et al; "QUBIC4X: An FT/FMAX=130/140GHZ SIGE: C-MICMOS Manufacturing Technology With Elite Passives For Emerging Microwave Applications"; IEEE BCTM 12.3; 2004; pp. 233-236.

* cited by examiner

*Primary Examiner* — Fernando L Toledo
*Assistant Examiner* — Kyoung Lee

(57) ABSTRACT

The invention relates to a method according to the part of the surface of the semiconductor body adjoining the opening and which is to be kept free is provided with a cover layer after which the high-crystalline layer is formed by means of a deposition process. The material of the cover layer can then easily be chosen such that it can be selectively etched relative to the silicon underneath. In addition, the cover layer can easily be selectively deposited on the relevant part of the surface because use can be made of an anisotropic deposition process. In such a process the cover layer is not deposited in the hollow and on the bottom of the hollow. It will be apparent that for the high-crystalline layer also other materials can be chosen such as SiGe having such low Ge contents that the SiGe cannot be etched selectively very well compared to the Silicon.

22 Claims, 6 Drawing Sheets

Figure 1:
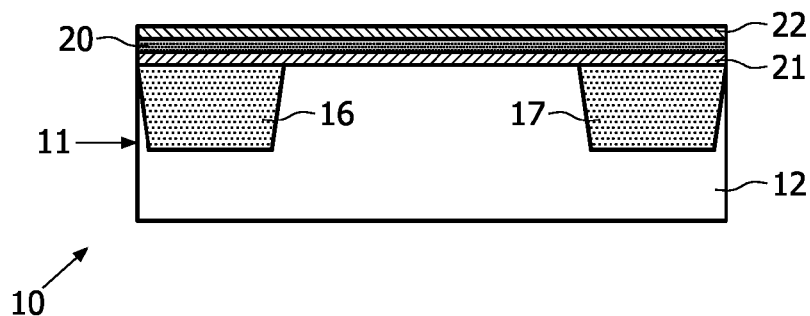
Figure 2:
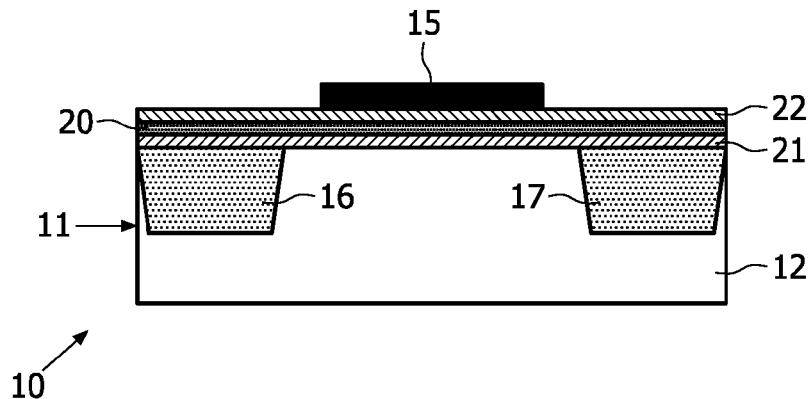

METHOD OF MANUFACTURING A BIPOLAR TRANSISTOR AND BIPOLAR TRANSISTOR OBTAINED THEREWITH

The invention relates to a method of manufacturing a semiconductor device comprising a substrate, a silicon semiconductor body and a bipolar transistor with an emitter region of a first conductivity type, a base region of a second conductivity type opposite to the first conductivity type, and a collector region of the first conductivity type, the method comprising:

depositing at least one epitaxial semiconductor layer on the surface of the semiconductor body in which the collector region is to be formed, the base region to be formed in the epitaxial semiconductor layer;

forming an etch stop layer on top of the epitaxial semiconductor layer;

depositing a silicon low-crystalline semiconductor layer on the etch stop layer;

forming a connecting zone of the base region in the semiconductor layer;

providing an opening in the low-crystalline semiconductor layer at the location of an emitter region to be formed, the opening extending to the etch stop layer, a portion of the etch stop layer covering the opening;

removing an adjoining portion of the etch stop layer by etching, thereby creating a hollow underneath the silicon low-crystalline semiconductor layer adjoining and connected with the opening; and forming a high-crystalline semiconductor layer in the hollow.

Such a method is known from US patent 2001/0053584. In that document is disclosed a method of manufacturing a semiconductor device with a bipolar transistor, in which, on a monocrystalline substrate having STI regions (Shallow Trench Isolation), a number of semiconductor layers are deposited epitaxially for the formation of a base region of the transistor. On top of these semiconductor layers an etch stop layer is deposited covered by a polycrystalline silicon layer and a dielectric layer. An opening is made in these covering layers to form the emitter region. When the etch stop layer is reached, the portion of the etch stop layer covering the opening and adjoining portions of the etch stop layer are removed by means of etching by another etching means. Then a semiconductor layer of silicon and germanium is deposited uniformly and the hollow obtained from the under etching of the etch stop layer is completely filled up. The SiGe layer on the monocrystalline silicon surface adjoining the opening and in the adjacent hollow underneath the polycrystalline layer has a high-crystalline nature, but the layer has a low-crystalline nature elsewhere. The portion of this SiGe layer adjoining the opening is then removed by selective etching relative to the silicon lying underneath. After this the emitter region is formed by means of the opening.

A drawback of the known method is that the RF properties of the devices obtained with it leave much to be desired in a number of cases.

Therefore, it is an object of the invention to provide a method that does not cause this problem and thus results in devices that have optimum RF properties and, moreover, is simple.

To this end, according to the invention a method of the type set out in the opening paragraph is characterized in that the formation of the high-crystalline semiconductor layer is carried out in such a manner that a part of the surface of the semiconductor body adjoining the opening is kept free from the high-crystalline semiconductor layer. In the first place the invention is based on the recognition that the use of a SiGe layer has several drawbacks. For example, a device manufactured with the known method may have a greater defect density, which is undesired. Defects may develop from exposure of the SiGe mixing crystal filling the hollow to oxygen, for example when spacers against the wall of the opening and the filled hollow are formed. Another drawback of the use of a SiGe layer as a high-crystalline semiconductor layer is that this cannot be easily etched selectively with respect to the silicon.

A resulting roughening and/or deepening of the silicon surface is also detrimental to the properties of the device. The invention is also based on the recognition that when a material such as silicon is used for the formation of the high-crystalline layer, the device is much less sensitive to defects developing as a result of a reaction to oxygen.

Finally, the invention is based on the recognition of a problem that the monocrystalline or substantially high-crystalline silicon that is deposited on a part of the silicon surface adjoining the opening cannot be selectively etched with respect to the (monocrystalline) silicon underneath. This does not occur with a method according to the invention, because it is then avoided that high-crystalline silicon is formed on a part of the surface of the semiconductor body adjoining the opening.

As a result of the presence of high-crystalline or monocrystalline semiconductor material in the hollow, the minimum distance that can be obtained between the emitter region and the extrinsic base in the bipolar transistor can be reduced in a non-self-aligning structure of the device, without modifying that structure. As a result, doping atoms can also diffuse closer to the emitter region. The surface of the active region can also be reduced because the edge of a patterned etch stop layer may overlap the edges of the STI regions. All this is beneficial to the RF properties of the transistor manufactured in this manner.

In a first embodiment of a method according to the invention the part of the surface of the semiconductor body adjoining the opening and which is to be kept free is provided with a cover layer after which the high-crystalline layer is formed by means of a deposition process. The material of the cover layer can then easily be chosen such that it can be selectively etched relative to the silicon underneath. In addition, the cover layer can easily be selectively deposited on the relevant part of the surface because use can be made of an anisotropic deposition process. In such a process the cover layer is not deposited in the hollow and on the bottom of the hollow. It will be apparent that for the high-crystalline layer also other materials can be chosen such as SiGe having such low Ge contents that the SiGe cannot be etched selectively very well compared to the silicon.

In an attractive variant of this embodiment the high-crystalline semiconductor layer is deposited by means of epitaxy. In this manner, the hollow is filled in a simple manner with, for example monocrystalline silicon. A for example (low-crystalline) silicon layer possibly developed on the cover layer and on other parts of the surface of the device can easily be removed, for example, by means of selective etching. At any rate the cover layer can easily be removed by means of selective etching relative to the silicon underneath by choosing a suitable material for that layer. If need be a part of a silicon layer situated on the cover layer can be removed by means of a what is called lift-off.

Preferably in this case the high-crystalline semiconductor layer is deposited by means of selective epitaxy. This saves a method step of removing redundant portions of a silicon layer, because this is now exclusively formed as a monocrystalline layer in the hollow. The removal too of the cover layer afterwards is simplified by this.

Preferably a dielectric material is chosen for the material of the cover layer. As a result, this layer, once having performed its protective function, can be easily removed again by means of selective etching. Suitable dielectrics are, for example, silicon nitride and silicon dioxide. The latter is preferably used. Etching such material, which can be effected by means of an HF-based solution, is fully compatible with standard IC technology and does not form any menace at all to optimum (RF) properties.

In a further embodiment, for keeping the part of the surface of the semiconductor body adjoining the opening free, the high-crystalline semiconductor layer is formed by means of a portion of the low-crystalline semiconductor layer adjoining the hollow. This embodiment provides a form of epitaxial redistribution of silicon atoms already present in the low-crystalline semiconductor layer. Supply of silicon atoms from the gaseous phase, as takes place in a conventional epitaxial process, does not take place so that deposition of silicon on the part of the surface adjoining the opening does not take place. Since the low-crystalline semiconductor layer is not found in the opening, in this embodiment it is thus impossible for material of the low-crystalline semiconductor layer to end up on the part of the surface of the semiconductor body adjoining the opening. It will be evident that this variant is highly attractive because of its simplicity, for example because one of the deposition processes has become redundant. The deposition of the high-crystalline semiconductor layer can be realized by means of a suitable heat treatment of the device to process the low-crystalline layer adjoining the hollow.

Preferably, in this embodiment an amorphous semiconductor material is chosen for the material of the low-crystalline semiconductor layer. On the one hand, the thermal budget necessary for obtaining a high-crystalline layer is not greatly increased because the major part of it is determined by the transition of polycrystalline material to monocrystalline material. On the other hand, a phenomenon such as roughening can advantageously be made use of, which particularly occurs at the transition from amorphous to polycrystalline material. As a result, when the hollow is sufficiently shallow, a part of the low-crystalline layer situated above it can easily make contact with the monocrystalline surface of the semiconductor body situated underneath the hollow and the formation of a high-crystalline material from said part is simplified. This part is thus first converted into a polycrystalline material after which the polycrystalline material is converted into the high-crystalline semiconductor layer. Preferably, the thickness of the etch stop layer and thus the height of the hollow is selected so small that a bottom part of the low-crystalline semiconductor layer can, by means of a heat treatment, be brought into contact with a part of the surface of the semiconductor body adjoining the hollow.

An advantageous variant of all the embodiments defined above is characterized in that silicon is chosen for the material of the high-crystalline semiconductor layer. Silicon is also chosen for the material of the low-crystalline semiconductor layer.

The etch stop layer is preferably applied in a pattern. In this way the etch stop layer can be removed in its entirety even when it has a small thickness. This renders the conductive properties of the semiconductor body optimal and thus also the RF features of the transistor. A patterned etch stop layer may thus be obtained by deposition through a mask having holes and being located over the semiconductor body. An extremely simple way of achieving this result is the uniform deposition of the etch stop layer, after which the latter is patterned by means of photolithography and etching.

The etch stop layer can be deposited as an oxide layer and an overlying silicon layer. This is of particular interest if a very thin hollow is desired, for example when the high-crystalline layer is to be formed by processing the low-crystalline layer above the hollow. For example, the oxide layer can have a thickness less than 10 nm (e.g. 1 to 5 nm) and the silicon layer can have a thickness more than 20 nm.

The patterning can comprise patterning only the silicon layer using a plasma dry etch. Patterning only of the silicon layer is required if there is subsequent removal of the underlying oxide layer outside the pattern by another process, such as a preclean process prior to deposition of the overlying silicon low-crystalline semiconductor layer.

In an advantageous embodiment, subsequent to the formation of the high-crystalline semiconductor layer, the walls of the opening are provided with spacers after which the emitter region is formed therebetween.

The invention also relates to a semiconductor device obtained by means of the method according to the invention.

Figure 9:
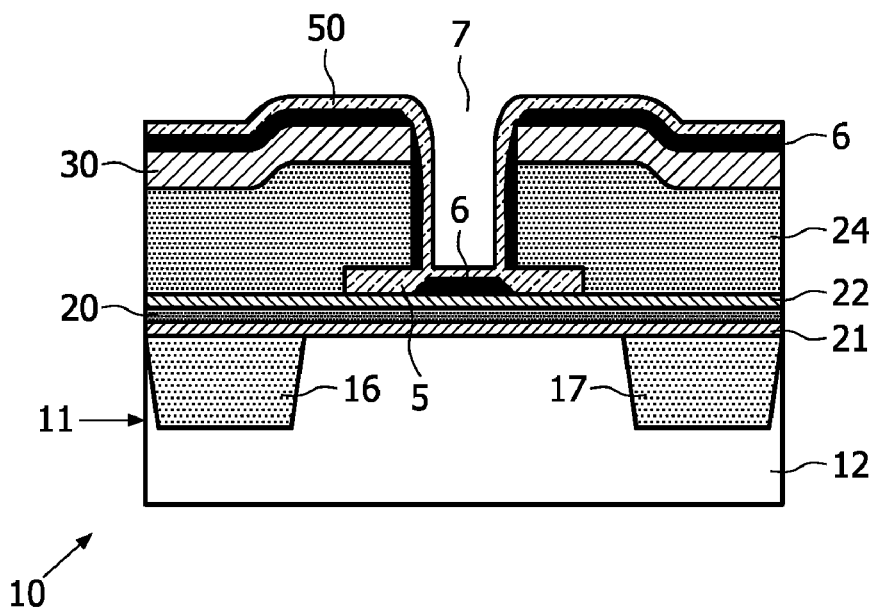
Figure 10:
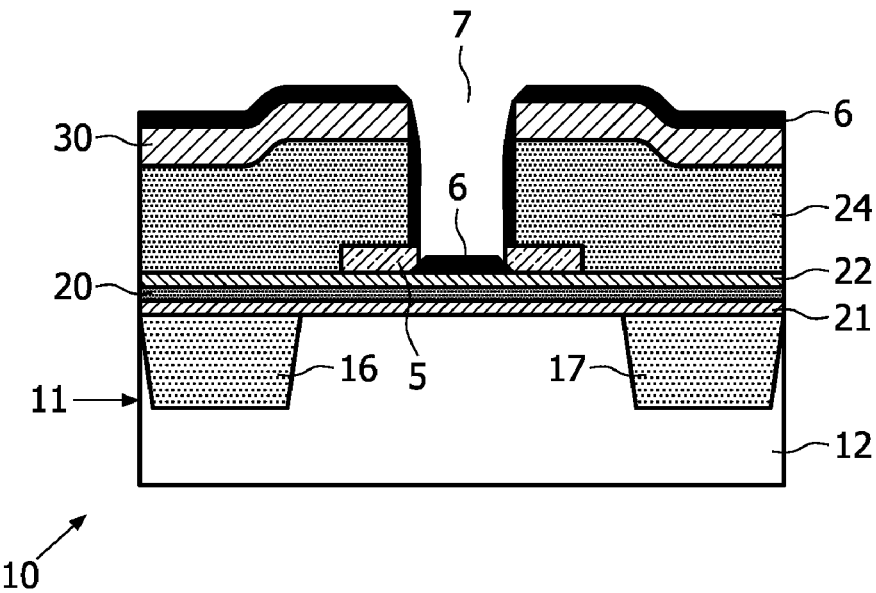
Figure 11:
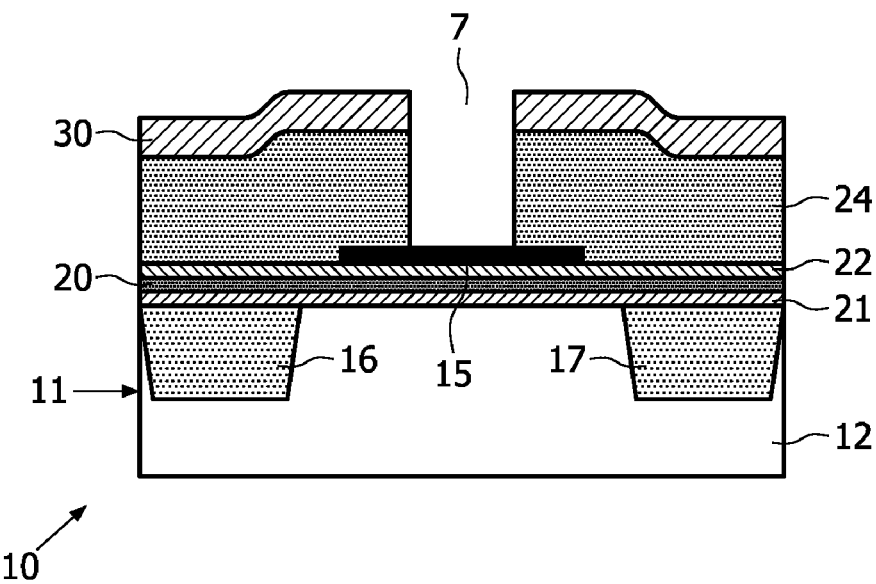
Figure 12:
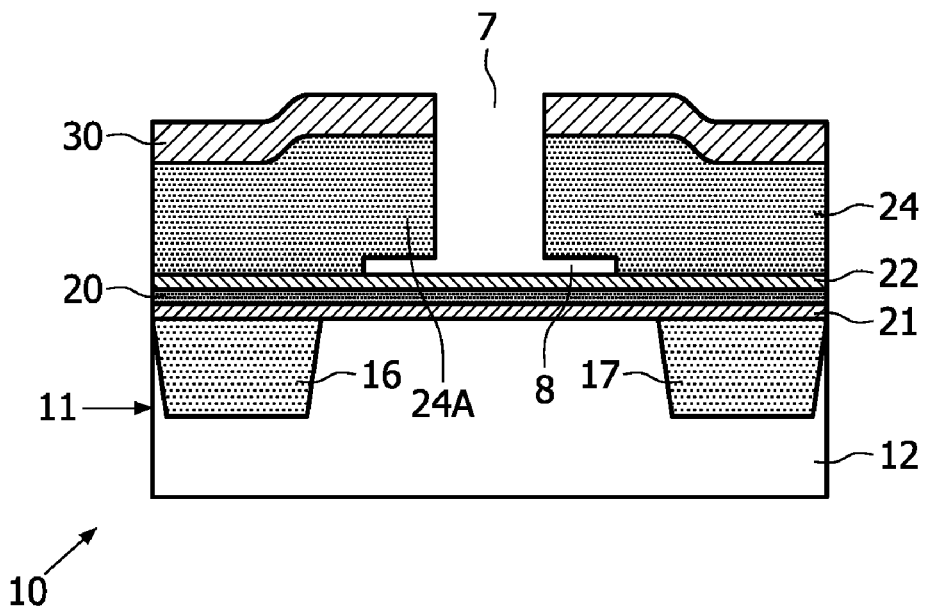
Figure 13:
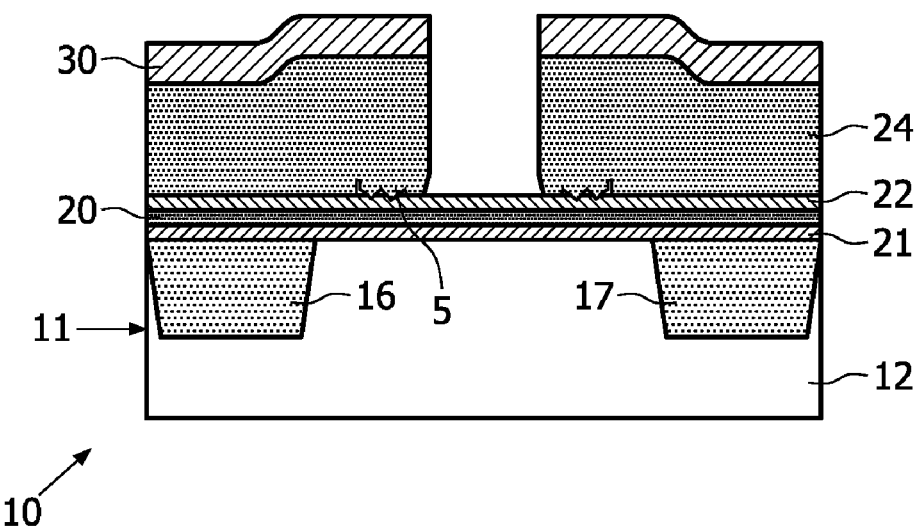

Further aspects, effects and details of the invention will be described hereinafter by means of three examples of embodiment illustrated in the drawings. In these drawings:

FIGS. 1 to 8 show schematically and in a cross-section perpendicular to the thickness direction a device comprising a bipolar transistor in consecutive stages in manufacturing by means of a first embodiment of a method according to the invention;

FIGS. 9 to 10 show schematically and in a cross-section perpendicular to the thickness direction a device comprising a bipolar transistor in consecutive relevant stages in manufacturing by means of a second embodiment of a method according to the invention; and FIGS. 11 to 13 show schematically and in a cross-section perpendicular to the thickness direction a device comprising a bipolar transistor in consecutive relevant stages in manufacturing by means of a third embodiment of a method according to the invention.

The Figures have not been drawn to scale and some dimensions have been exaggerated in the drawing figures for clarity. Like regions or parts have been given like reference numerals as much as possible.

FIGS. 1 to 8 show schematically and in a cross-section perpendicular to the thickness direction a device comprising a bipolar transistor in consecutive stages in manufacturing by means of a first embodiment of a method according to the invention.

As shown in FIG. 1, an n-type silicon substrate 12 forms the starting point and STI (Shallow Trench Isolation) regions 16, 17 are formed in the substrate. On top of this, p-type layers 21, 20, 22 are first deposited by means of epitaxy, the middle layer 20 being made of a mixing crystal of silicon and germanium having a Ge content of 20% atoms and in this example being provided with a doping concentration ranging from $1\times10^{18}$ at/cm$^3$ to $5\times10^{19}$ at/cm$^3$.

On either one of the two sides of the layer 20, in which later on a base region is formed, further semiconductor layers 21, 22 are deposited which function as transition layers and contain a lower doping concentration, for example, ranging from $1\times10^{17}$ at/cm$^3$ to $1\times10^{18}$ at/cm$^3$ and for which a thickness of about 20 nm is chosen. Subsequently, an emitter region is formed in the transition layer 22 by means of outdiffusion and overdoping. In this example, the emitter region and collector region are made of silicon.

In an alternative example, a collector region to be formed between the STI regions 16, 17 may further also be built up from a low-doped part, called the drift region, and a high-doped part that borders the substrate 12. The local dimensions of the device 10 in this example are chosen to be substantially equal to 1 μm×10 μm. A doping concentration of about $10^{20}$ at/cm$^3$ and a thickness of about 10 nm are chosen for the emitter region to be formed.

Then, for example in another deposition arrangement (see FIG. 2), an etch stop layer 15 is deposited. For example CVD (Chemical Vapor Deposition) can be used as the deposition technique. In this example, the etch stop layer 15 is made of silicon dioxide and about 10 nm thick. The etch stop layer 15 is patterned by means of photolithography and etching.

Figure 3:
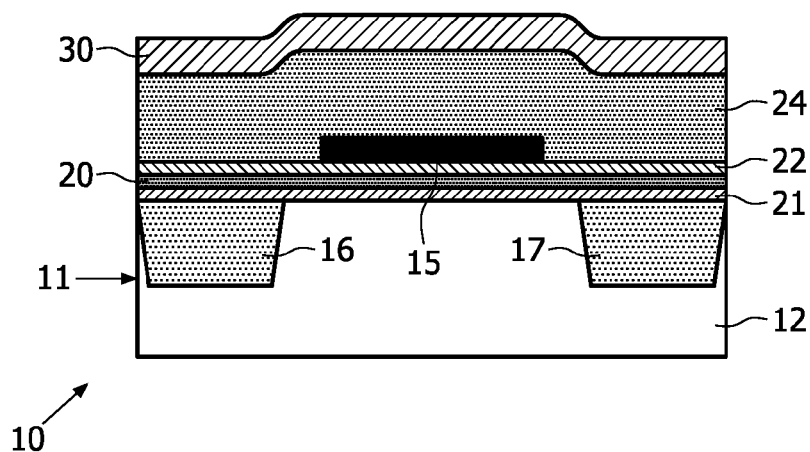

As shown in FIG. 3, in another deposition arrangement or another two layers 24, 30 are deposited, in this case made of polycrystalline silicon (layer 24) and silicon nitride (layer 30), and having a thickness of 200 nm and 100 nm, respectively. The polycrystalline silicon layer 24 is doped for example in situ. Another possibility is the application of an ion implantation between the deposition of layer 24 and 30, or an ion implantation after the deposition of the two layers and through the (relatively thin) dielectric layer 30. An additional mask—not shown in the drawing—can then also be used for locating the implantation.

First, by means of photolithography and etching (see FIG. 4), an opening 7 is formed in the silicon nitride layer 30 after which, by means of etching, for example plasma etching, the opening 7 is deepened up to the etch stop layer 15.

Figure 5:
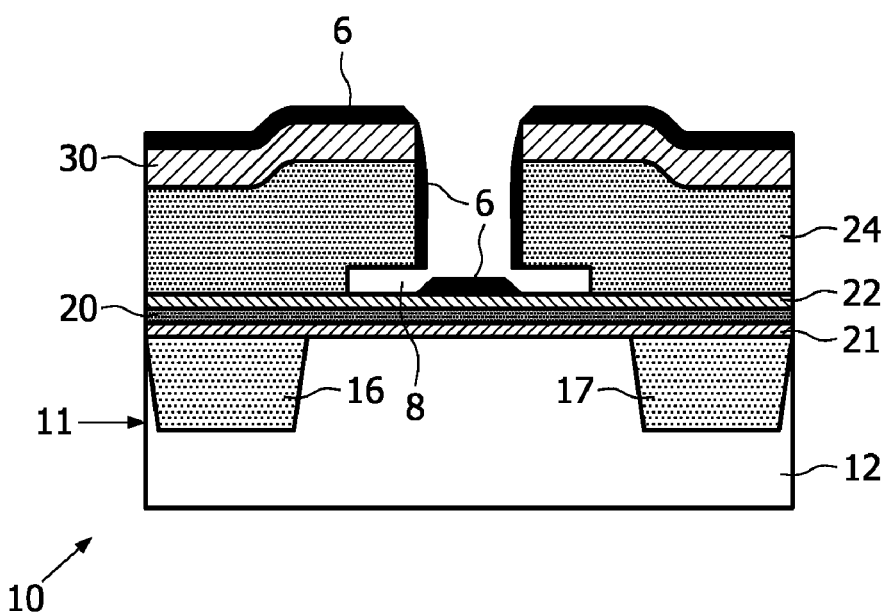
Figure 6:
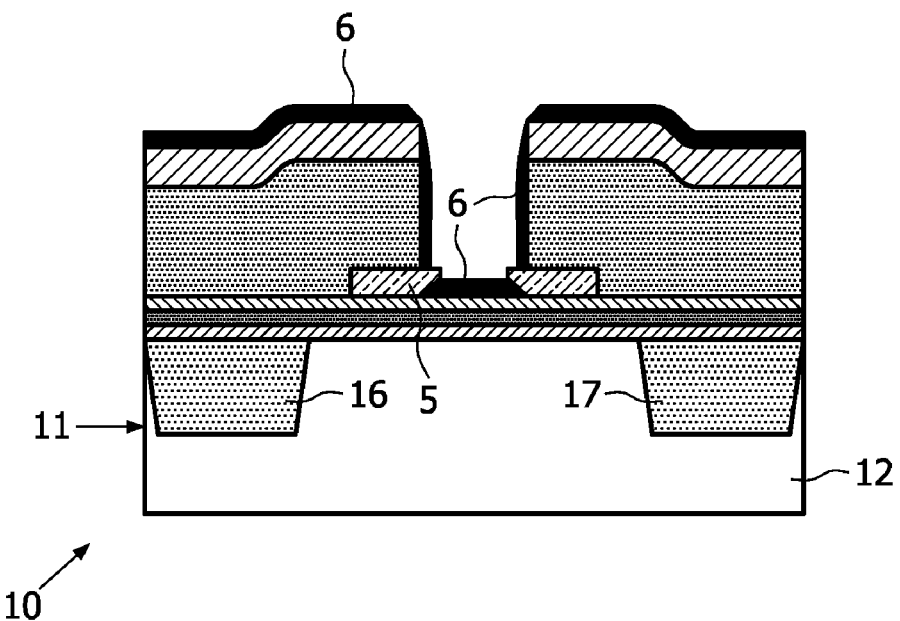

By means of a wet chemical (isotropic) etching process, the etch stop layer 15 is fully removed (see FIG. 5). Hydrofluoric acid (HF)—either buffered or not—is then used as an etching agent for this purpose. On one or both of the two sides of the opening 7 a hollow 8 is then formed underneath the low-crystalline layer 24 of polycrystalline silicon. After return to a deposition arrangement the device 10 is provided with a deposition cover layer 6 in anisotropic manner, which cover layer 6 is made of silicon dioxide here and has a thickness of 5 nm. In this example use is made of a HDP (High Density Plasma) CVD silicon dioxide layer 6.

Subsequently, (see FIG. 6) a high-crystalline layer 5, for example comprising monocrystalline silicon, is deposited in the hollow 8 by means of selective epitaxy. The deposited silicon is preferably doped, for example with boric atoms. An advantage of the concept described here, in which selective epitaxy is used compared with for example a technique in which the intrinsic base profile is made by means of selective epitaxy, is the fact that in the case described here the requirements made on the selective epitaxy process are less stringent. This renders the use of selective epitaxy less inconvenient.

This is followed (see FIG. 7) by the removal of the cover layer 6 by means of selective etching, while use is made of an etching agent such as the said buffered HF solution. Even the parts of the cover layer 6 lying on the top surface of the device 10 and against the walls of the opening 7 are then removed simply and selectively.

After this (see FIG. 8) spacers 4 against the walls of the opening 7 are formed, here built up from a region of silicon dioxide 41 for example about 10 nm thick, and a 50 nm to 100 nm thick silicon nitride region 42. This takes place by uniformly depositing layers of the materials and then etching the horizontal parts thereof by means of an anisotropic process such as RIE (Reactive Ion Etching). Afterwards, the remaining part of the opening 7 is filled with a layer of n-type polycrystalline silicon 1A. This layer is deposited by means of CVD.

By means of a heat treatment of the resulting structure an emitter region 1 is formed by local overdoping by outdiffusion of the n-type impurities in the emitter connection region 1A in the transition layer 22. This emitter region is then situated above the base region 2 formed in the base layer 20. With this heat treatment, or another one, impurities also from the low-crystalline layer 24 and from the high-crystalline layer 5 are diffused in the bordering parts of the transition layer 22. These parts form a part of what is called the "extrinsic base" or the "base connection region". As a result of the relatively high doping of the said (partial) regions 5, 24, 22 and as a result of the complete lack of the electrically insulating etch stop layer, the device 10 of this example has an extremely low extrinsic base resistance and thus extremely good high-frequency properties.

Finally, contact openings and connection conductors for example of a metal silicide not yet included in the drawing are formed by the emitter region 1 and the base region 2. Also the collector region 3 is then provided with a connection conductor, which may be located at the top or underside of the device 10. After application of a separating technique such as sawing or etching, separate devices 10 can be obtained.

FIGS. 9 to 10 show schematically and in a cross-section perpendicular to the thickness direction a device comprising a bipolar transistor in consecutive relevant stages in manufacturing by means of a second embodiment of a method according to the invention. The first manufacturing steps are the same as those described with the first example with reference to FIGS. 1 to 5.

In the variant of this embodiment (see FIG. 9) the high-crystalline silicon layer 5 is deposited not with selective but with non-selective epitaxy. This means that in addition to the high-crystalline silicon layer 5, which fills up the hollow 8, also a low-crystalline layer 50 is formed on the dielectric-covered parts of the surface of the semiconductor body 11, including the walls of the opening 7 and the top of the cover layer 6.

Subsequently, as shown in FIG. 10, the low-crystalline silicon layer 50 is removed in a selective manner relative to the high-crystalline silicon layer 5. An etching technique/etching agent is then used for this purpose with which polycrystalline silicon is selectively etched relative to the monocrystalline silicon.

Figure 7:
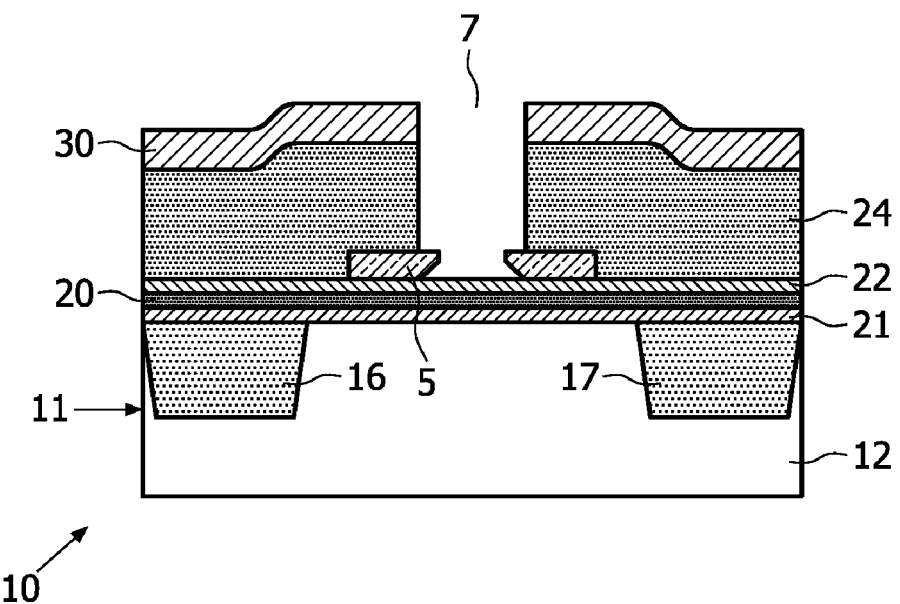
Figure 8:
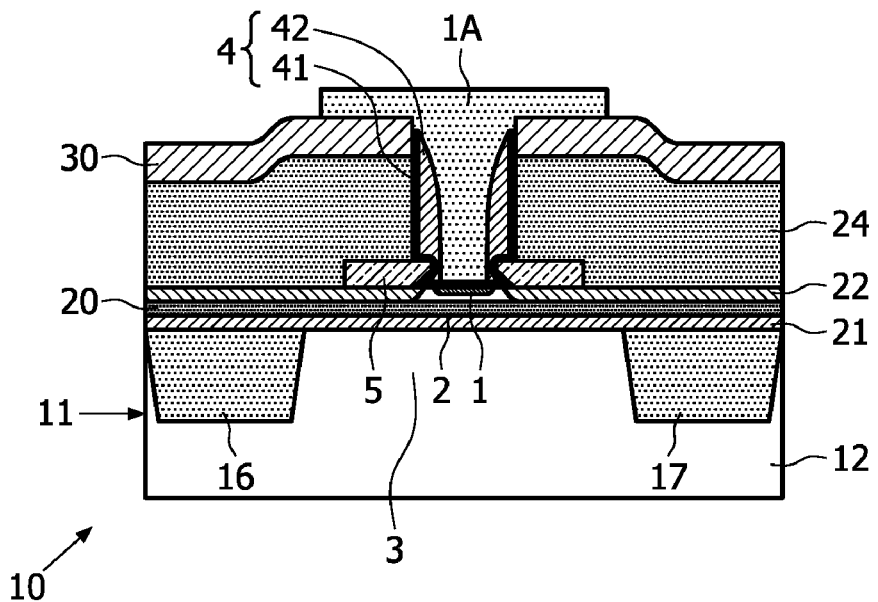

Manufacturing is then continued and completed as described with the first example with reference to FIGS. 7 to 8, with removal of the cover layer 6, and formation of the spacers and emitter region formation.

FIGS. 11 to 13 show schematically and in a cross-section perpendicular to the thickness direction a device comprising a bipolar transistor in consecutive relevant stages in manufacturing by means of a third embodiment of a method according to the invention. In this example the first steps in manufacturing are equal to those described with reference to FIGS. 1 to 4 of the first example. Different from that example, the low-crystalline semiconductor layer 24 is not a polycrystalline layer but an amorphous silicon layer 24.

Once the opening 7 has been formed (see FIG. 11) as with the first example in which the etch stop layer 15 is removed, the etch stop layer (see FIG. 12) is also removed in the same way as in the first example. A part of the amorphous silicon layer 24 located above the hollow is referred to as 24A.

Subsequent to this (see FIG. 13) the device is subjected to a heat treatment at for example 700 degrees Centigrade and for 60 seconds and preferably at N2/H2 atmosphere and with the aid of an oven or lamp. The amorphous silicon layer 24 is then converted into a polycrystalline silicon layer 24 where a roughening develops at the free part 24A thereof. Since the thickness of the etch top layer 15 and, consequently, the height of the hollow 8 in this example have the relatively low value of 10 nm, the roughening that develops is sufficient to realize contact between the (meanwhile) polycrystalline semiconductor layer 24, more particularly part 24A thereof, and the surface of the semiconductor body 11 underneath the hollow.

In a subsequent heat treatment of the device 10, for example at 900 degrees Centigrade and for 60 seconds and preferably at H2 atmosphere and with the aid of an epitaxy appliance, the high-crystalline, monocrystalline in this case, silicon layer 5 is formed from the part 24A of the polycrystalline silicon layer 24 by means of epitaxy, which silicon layer 5 fills up the hollow 8. It is also possible to use a combination of—not necessarily selective—one or more isotropic and/or anisotropic etching techniques to obtain the desired result, which is a hollow 8 filled up with the high-crystalline (silicon) layer 5.

The manufacturing is continued and accomplished as described with reference to the first example in FIG. 8, again providing the formation of the spacers and emitter region. In this case, the high crystalline regions 5 are not deposited but are formed by processing of the layer 24.

Because of its simplicity, the method described in this third example is highly suitable for a manufacturing process carried out on an industrial scale.

As mentioned above, the example of FIGS. 11 to 13 requires a very thin hollow 8, for example of height 10 nm or less. This in turn requires a very thin sacrificial etch stop oxide layer 15. In practice, it is difficult to maintain a reliable thickness and pattern integrity with such a thin oxide layer. An improvement is therefore to use a multi-layer etch stop arrangement. Instead of only an oxide layer, a stack of two layers can be used, comprising an oxide that is covered with material identical to that of either:

layer 24, namely the amorphous silicon layer (although it is noted that this multi-layer etch stop can also be used in the polycrystalline silicon examples), or the transition layer 22.

This provides a protective cap that ensures the very thin underlying oxide is not damaged or removed during the patterning steps and the subsequent precleans that are required prior to deposition of the layer 24. These precleans are generally aggressive to oxide layers (i.e. intended to remove native oxide) hence they would attack the very thin oxide layer and compromise thickness and/or pattern integrity. The Si cap prevents this damage to the oxide layer, which is required to form the hollow 8 with accurate dimensions.

Figure 4:
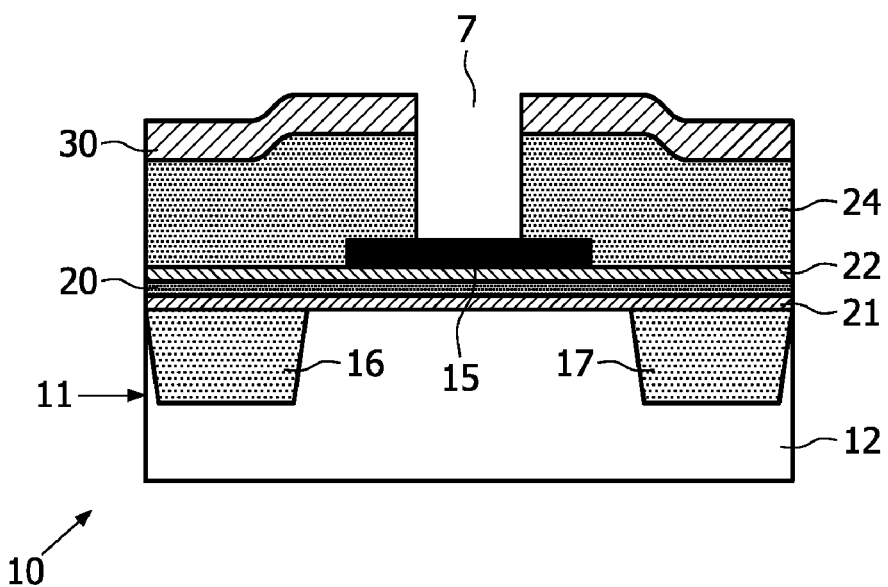

In one example, the etch stop layer comprises a high temperature oxide (HTO) of thickness 10 to 50 Angstroms (1 to 5 nm), capped with a polysilicon layer of around 50 nm. The polysilicon layer should ideally be thicker than 20 nm to enable it to be free of pinholes. This polysilicon layer then acts as an efficient block to the HF etchant used to pattern the opening 7 in the layer 24 (as shown in FIG. 4).

Patterning of the etch stop stack can be carried out using a plasma dry etch that only etches the silicon (amorphous or polysilicon) of the cap layer. The remaining underlying oxide outside the etch stop area is then not protected and can be removed by the subsequent HF patterning or cleaning performed prior to deposition of the layer 24.

In the examples above, the etch stop layer 15 (or the oxide layer of the multi-layer etch stop stack) is deposited, for example by CVD. In another example, an oxidation process can be used, for example by adding oxygen prior to the deposition of the polysilicon or amorphous silicon layer 24. The resulting in-situ oxide layer formation typically has a thickness of 1-2 nm. The end result is essentially the same as a deposited oxide layer.

The plasma dry etch needs to stop on this thin layer, and highly selective etch chemistries are available for this purpose, for example as sued for patterning the gate polysilicon in CMOS technologies.

This approach can avoid the need for any etch stop patterning at all, if the oxide layer is sufficiently thin that it does not provide an insulating barrier. The base connection can still be made, and Boron doping can penetrate through the oxide layer.

The invention is not limited to the examples of embodiment provided, since within the scope of the invention many variations and modifications are possible for the expert. For example, the invention cannot only be implemented in the manufacture of discrete semiconductor devices, but also pre-eminently be implemented in the manufacture of integrated semiconductor devices such as a bipolar or BICMOS (Bipolar Complementary Metal Oxide Semiconductor) IC (Integrated Circuit). Actually, the manufacture of the device with the bipolar transistor described in the examples is pre-eminently suitable for use in a (BICMOS) IC.

Further it is observed that isolation regions obtained from the application of the LOCOS (Local Oxidation Of Silicon) technique can be used in lieu of STI isolation regions.

Further it is observed that advantageously a polycrystalline silicon layer can be used for the low-crystalline layer in the third embodiment discussed. Also in that case it is conceivable to carry out a heat treatment in two steps.

A heat treatment in two steps can take place in two consecutive steps, but also be interrupted by another step. For example, it is possible to carry out part of the required heat treatment of the low-crystalline semiconductor layer already before the etch stop layer has been removed.

Finally it is observed that in the third embodiment SiGe material may nevertheless be used for the high-crystalline semiconductor layer. For in that case the low-crystalline semiconductor layer may contain a mixing crystal of SiGe for local formation of a high-crystalline SiGe region in the hollow. Since it is no longer necessary to etch away SiGe at any rate, this drawback is eliminated in this variant of a method according to the invention.

The invention claimed is:

1. A method of manufacturing a semiconductor device comprising a substrate, a silicon semiconductor body and a bipolar transistor with an emitter region of a first conductivity type, a base region of a second conductivity type opposite to the first conductivity type, and a collector region of the first conductivity type, the method comprising:

depositing at least one epitaxial semiconductor layer on the surface of the semiconductor body in which the collector region is to be formed, the base region to be formed in the epitaxial semiconductor layer, forming an etch stop layer on top of the epitaxial semiconductor layer;

depositing a silicon low-crystalline semiconductor layer on the etch stop layer;

forming a connecting zone of the base region in the semiconductor layer;

providing an opening in the low-crystalline semiconductor layer at the location of an emitter region to be formed, the opening extending to the etch stop layer, a portion of the etch stop layer covering the opening;

removing an adjoining portion of the etch stop layer by etching, thereby creating a hollow underneath the silicon low-crystalline semiconductor layer adjoining and connected with the opening; and forming a high-crystalline semiconductor layer in the hollow, characterized in that the formation of the high-crystalline semiconductor layer is carried out in such a manner that a part of the surface of the semiconductor body adjoining the opening is kept free from the high-crystalline semiconductor layer.

2. A method as claimed in claim 1, characterized in that the part of the surface of the semiconductor body adjoining the opening and which is to be kept free is provided with a cover layer after which the high-crystalline layer is formed by a deposition process.

3. A method as claimed in claim 2, characterized in that the high-crystalline semiconductor layer is deposited by epitaxy.

4. A method as claimed in claim 2, characterized in that the high-crystalline semiconductor layer is deposited by of selective epitaxy.

5. A method as claimed in claim 2, characterized in that a dielectric material is chosen for the material of the cover layer.

6. A method as claimed in claim 5, characterized in that silicon dioxide is chosen for the dielectric material of the cover layer.

7. A method as claimed in claim 1, characterized in that for keeping the part of the surface of the semiconductor body adjoining the opening free, the high-crystalline semiconductor layer is formed by a portion of the low-crystalline semiconductor layer adjoining the hollow.

8. A method as claimed in claim 7, characterized in that an amorphous semiconductor material is chosen for the material of the low-crystalline semiconductor layer.

9. A method as claimed in claim 8, characterized in that the amorphous material of the low-crystalline semiconductor layer is first converted into a polycrystalline material after which the polycrystalline material is converted into the high-crystalline semiconductor layer.

10. A method as claimed in claim 7, characterized in that the thickness of the etch stop layer and thus the height of the hollow is selected to be so small that a bottom part of the low-crystalline semiconductor layer can, by a heat treatment, be brought into contact with a part of the surface of the semiconductor body adjoining the hollow.

11. A method as claimed in claim 1, characterized in that silicon is chosen for the material of the high-crystalline semiconductor layer.

12. A method as claimed in claim 1, characterized in that silicon is chosen for the material of the low-crystalline semiconductor layer.

13. A method as claimed in claim 1, characterized in that the etch stop layer is deposited in a pattern.

14. A method as claimed in claim 13, characterized in that the etch stop layer is deposited in a uniform manner after which it is patterned by photolithography and etching.

15. A method as claimed in claim 13, characterized in that the etch stop layer is deposited as an oxide layer and an overlying silicon layer.

16. A method as claimed in claim 15, characterized in that the oxide layer has a thickness less than 10 nm and the silicon layer has a thickness more than 20 nm.

17. A method as claimed in claim 15, characterized in that the oxide layer has a thickness in the range 1 to 5 nm and the silicon layer has a thickness more than 20 nm.

18. A method as claimed in claim 15, characterized in that the patterning comprises patterning only the silicon layer using a plasma dry etch.

19. A method as claimed in claim 1, characterized in that subsequent to the formation of the high-crystalline semiconductor layer, the walls of the opening are provided with spacers after which the emitter region is formed there between.

20. A method as claimed in claim 1, characterized in that the bipolar transistor is arranged as a heterojunction transistor.

21. A method as claimed in claim 1, wherein the etch stop layer is formed by deposition.

22. A method as claimed in claim 1, wherein the etch stop layer is formed by oxidizing the epitaxial semiconductor layer.

* * * * *